United States Patent [19]

Camilletti et al.

[11] Patent Number: 5,693,565
[45] Date of Patent: Dec. 2, 1997

[54] SEMICONDUCTOR CHIPS SUITABLE FOR KNOWN GOOD DIE TESTING

[75] Inventors: Robert Charles Camilletti; Mark Jon Loboda; Keith Winton Michael, all of Midland, Mich.

[73] Assignee: Dow Corning Corporation, Midland, Mich.

[21] Appl. No.: 679,590

[22] Filed: Jul. 15, 1996

[51] Int. Cl.⁶ .................................................. H01L 21/44
[52] U.S. Cl. ................................................................ 437/192
[58] Field of Search ........................... 437/183, 189, 437/192, 195, 203

[56] References Cited

U.S. PATENT DOCUMENTS

| | | | |
|---|---|---|---|
| 3,615,272 | 10/1971 | Collins | 23/266 |
| 4,999,397 | 3/1991 | Weiss | 524/755 |
| 5,010,159 | 4/1991 | Bank | 528/23 |
| 5,011,706 | 4/1991 | Tarhay | 427/39 |
| 5,057,453 | 10/1991 | Endo et al. | 437/183 |
| 5,130,275 | 7/1992 | Dixon | 437/192 |
| 5,376,584 | 12/1994 | Agarwala | 437/189 |
| 5,424,652 | 6/1995 | Hembree | 324/765 |
| 5,480,836 | 1/1996 | Harada et al. | 437/192 |
| 5,483,741 | 1/1996 | Akran | 29/846 |
| 5,495,667 | 3/1996 | Farnworth | 29/843 |
| 5,597,737 | 1/1997 | Greer et al. | 437/183 |

FOREIGN PATENT DOCUMENTS

| | | |
|---|---|---|
| 60-86017 | 5/1985 | Japan . |
| 63-107122 | 5/1988 | Japan . |
| 59178749 | 7/1990 | Japan . |

*Primary Examiner*—Kevin Picardat
*Attorney, Agent, or Firm*—James L. Decesare

[57] ABSTRACT

A semiconductor integrated circuit (IC) die is made with enhanced resilience to handling, testing, and storage, associated with its qualification and distribution as a KNOWN GOOD DIE (KGD). The IC device has a mechanically tough and chemically inert top layer to protect it from damage. The device contacts are made of thin film metals which facilitate reversible electrical connections used in KGD testing. The overall contact structure protects the device from irreversible damage during the connection, test, and disconnection sequence.

11 Claims, 2 Drawing Sheets

SEMICONDUCTOR CHIPS SUITABLE FOR KNOWN GOOD DIE TESTING

BACKGROUND OF THE INVENTION

This invention is directed to a semiconductor integrated circuit chip or die more suitable in testing as an unpackaged die. It is so constructed and arranged as to enable testing of the device at the chip level using KNOWN GOOD DIE (KGD) soft connection techniques.

There is a rising trend among primary end users of integrated circuit (IC) die requiring integrated circuit manufacturers to supply packaged and unpackaged die that have been tested and certified as KNOWN GOOD DIE.

Such semiconductor devices are made from a starting substrate, usually a thin wafer of monocrystalline silicon, in which transistors and interconnections are fabricated using thin film processing steps. The resulting wafer contains a number of IC devices or die. The die are separated with a saw, and encapsulated in packages containing one or more of the die. Typically, the die are rigorously tested after they have been packaged.

However, without die level testing, the potential of packaging non-functioning devices exists, making their manufacture inefficient and costly. Therefore, testing of unpackaged die is highly desirable, and the use of only KNOWN GOOD DIE tends to increase industrial yields significantly.

While various types of KGD test fixtures exist, they all require that non-permanent electrical connections be made between the integrated circuitry on the die, and external test circuitry on the KGD test apparatus. The bond pads on the semiconductor die provide a connection point for testing integrated circuitry on the semiconductor die, but test apparatus generally employ different techniques for making non-permanent electrical connections to the bond pads.

For example, one KGD test apparatus employs a die contact member that utilizes a non-bonded tape automated bonding (TAB) technique. Other KGD test apparatus employ techniques such as non-permanent wire bonding, the use of probe tips to contact the bond pads, or the use of probe cards for making electrical contact with the bond pads of the semiconductor die. Recent examples of yet other types of KGD test apparatus for semiconductor die are shown in U.S. Pat. Nos. 5,424,652 (Jun. 13, 1995); 5,483,741 (Jan. 16, 1996); and 5,495,667 (Mar. 5, 1996); assigned to Micron Technology, Inc., Boise, Id.

Regardless of which bond pad connection technique is employed, however, it is important to effect the non-permanent connection in a manner which causes as little damage as possible to the bond pad. If a temporary connection damages the bond pad, the reliability of the IC device is significantly compromised.

KGD test procedures include BURN-IN which is a test protocol of electrically stressing the device at an elevated temperature and voltage environment for an adequate period of time to cause failure of marginal devices.

Following successful completion of the KGD test procedure, the temporary connection to the bond pad is broken, and the die is removed from the test fixture. The die is then certified as a reliable KNOWN GOOD DIE. The KGD can then be used in systems calling for unpackaged die, assembled in a conventional package, or packaged in a multichip module.

Because KGD testing methods require intimate contact with the IC surface, this device qualification technique has the potential of actually damaging a device during the process of certifying its quality. For example, the sharp tips of bonder apparatus used to make temporary connections can easily damage the device surface, if appropriate care is not taken during set-up. Even with appropriate set-up, dimensional tolerances of device contact locations and spatial repeatability of bonder tip alignment is such that misplacement is inevitable, and mechanical damage to the device surface occurs.

Other KGD techniques require use of temporary carriers in which die are loaded and held in place by mechanical force. The action of loading, securing, and subsequently removing die from the carrier can easily cause damage to the devices. Finally, since KGD testing follows fabrication of the device and its separation from the wafer, test environments are not comparable to the pristine ambient of IC fabrication clean-room areas. Handling and storage of devices during KGD testing can therefore result in its degradation due to both mechanical and environmental damage.

In contrast, our invention describes application of a series of IC fabrication steps, which when applied with an integrated circuit manufacturing procedure, produce a bare IC die which is suitable to rigorous handling associated with bare die testing. Thus, the die is passivated by a process which minimizes defects in its surface, enhancing its integrity. This reduced defect passivation process is implemented by thin film materials which have higher mechanical strength than those used in current manufacturing technology. The contact geometry of the device is designed to maximize the chemical isolation and minimize mechanical stress between successive metal layers required for making temporary electrical connections needed for KGD testing. The combination of a noble metal contact system used for the electrical connection, and the surface passivation system, provide hermetic equivalent sealing of the die. Their inertness allows KGD testing to be performed in any ambient, eliminating any need for controlled clean environments, which ultimately reduces costs. These features and benefits make such devices compatible and more resilient for bare die testing, and result in high testing and manufacturing yield of KGD.

BRIEF SUMMARY OF THE INVENTION

Our invention relates to a semiconductor chip that will perform better in KNOWN GOOD DIE test protocols. The semiconductor chip has a substrate with a surface containing integrated circuits interconnected with at least one bond pad. The integrated circuit has on its surface a primary passivation layer which overlays the semiconductor device. The primary passivation layer overlaps the edges of the bond pad, terminating in a tapered edge forming an opening or window over the bond pad. Such a semiconductor chip can be manufactured by:

A. applying a flowable liquid composition, (i.e., preferably a solution containing a preceramic silicon-containing resin such as hydrogen silsesquioxane resin), as part of the primary passivation layer, or on top of a previously applied primary passivation layer, to planarize the device surface;

B. heating the resin to a temperature sufficient to stabilize it;

C. applying an amorphous silicon carbide coating to the layer formed in step A to provide chemical and mechanical protection to the die;

D. exposing a portion of the bond pad by fabricating an opening or window through the layers applied in steps A–C;

E. optionally depositing and patterning a first diffusion barrier metal layer on the exposed portion of the bond pad, the first metal layer overlapping the opening in the primary passivation layer; and F. depositing a second, preferably non-corroding, conductive metal layer on the diffusion barrier metal layer above the bond pad, or if no diffusion barrier metal layer is used, then depositing the second metal layer on the exposed portion of the bond pad.

These and other features and objects of our invention will become apparent from a consideration of the detailed description.

Figure 1:
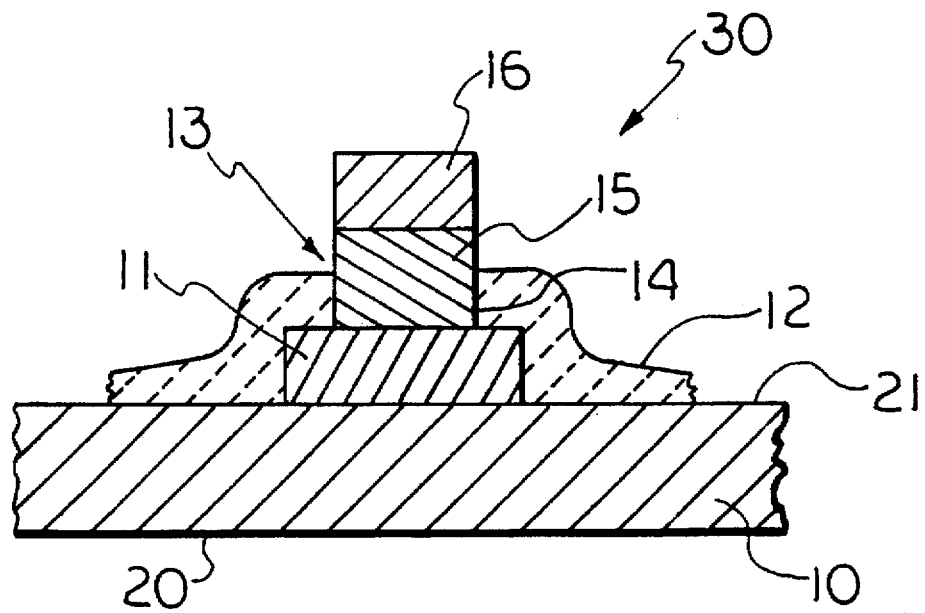
FIG. 1 is a side view shown in cross-section of a PRIOR ART semiconductor device over which our invention is an improvement.
Figure 2:
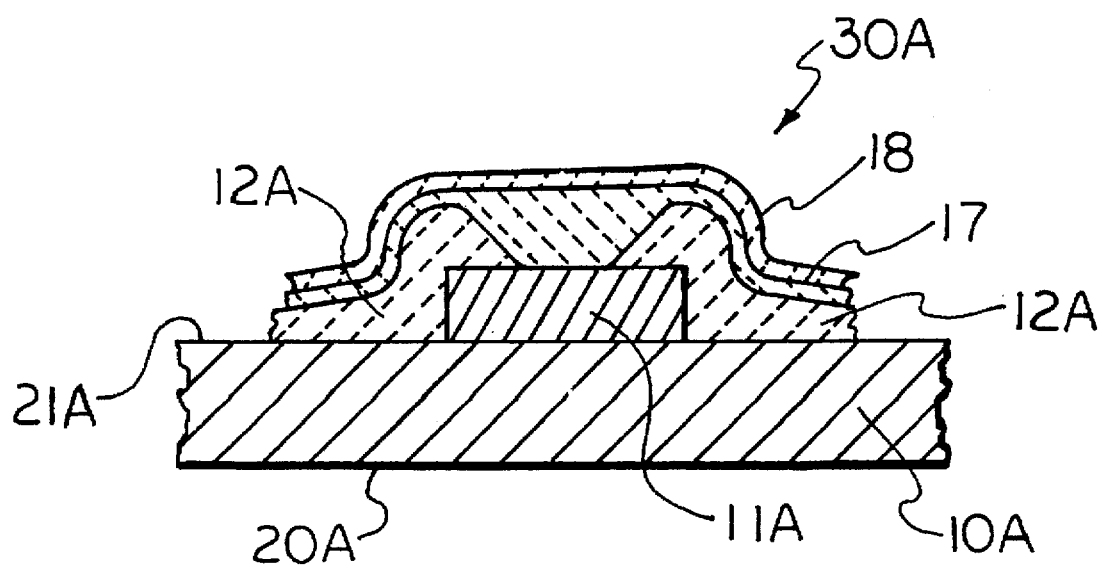
FIG. 2 is a side view in cross-section, similar to FIG. 1, but showing our improved semiconductor device in an early stage of its manufacture.
Figure 3:
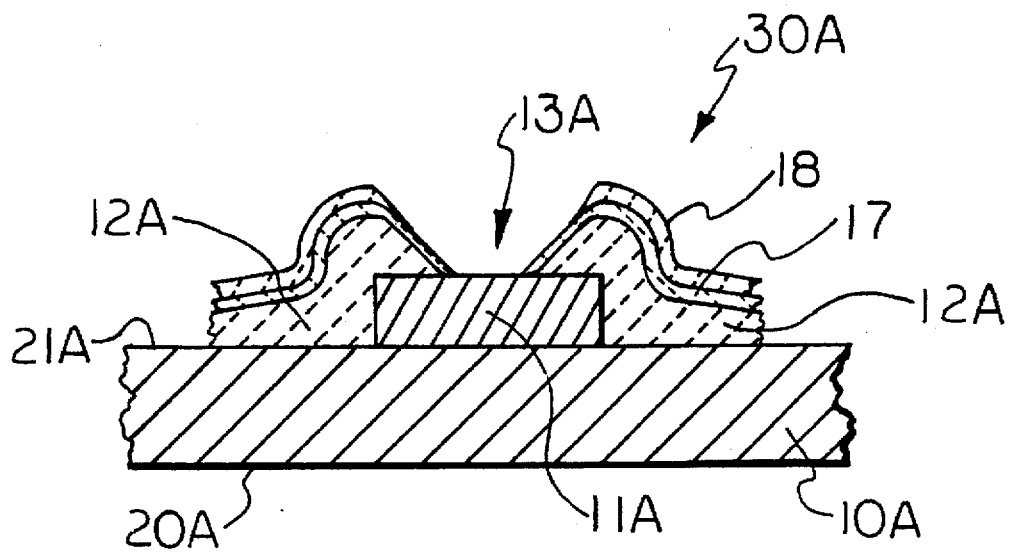
FIG. 3 is a side view in cross-section, similar to FIG. 2, showing our device in a later stage of its manufacture.
Figure 4:
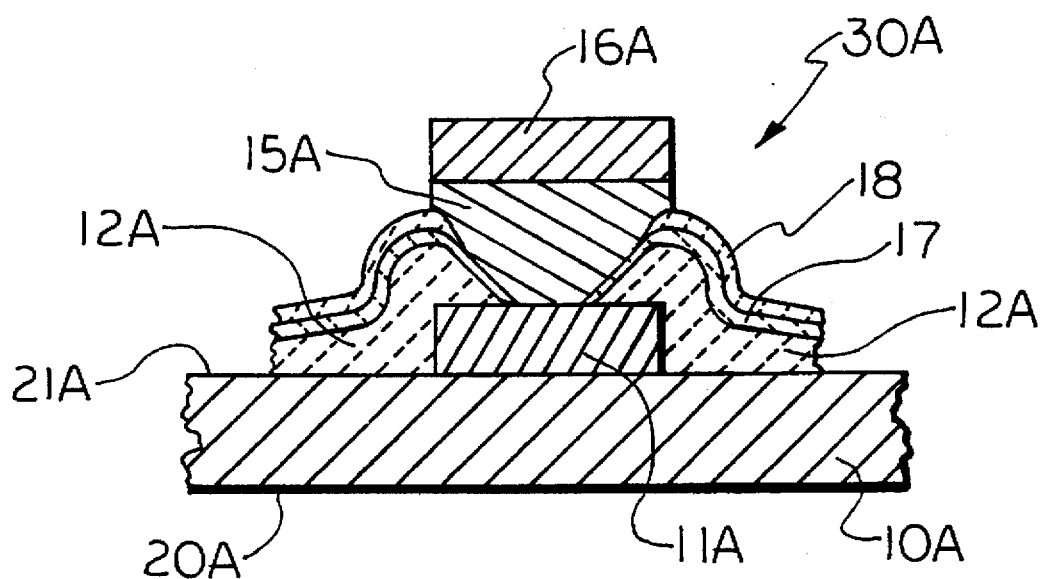
FIG. 4 is a side view in cross-section, similar to FIGS. 2 and 3, showing our finished device.

The letter "A" in FIGS. 2–4 is used to designate elements common to FIG. 1.

DETAILED DESCRIPTION

The PRIOR ART integrated circuit device 30 in FIG. 1 is composed of a silicon substrate 10 having a back non-circuit side 20, and a front side 21 on which integrated circuits are formed. These active devices contain diodes and transistors which form an integrated circuit when interconnected by a patterned metallic layer (not shown). The metallic interconnections terminate at bond pads 11 located on the front circuit side 21 of device 30. The bond pads 11 (only one of which is shown) are most commonly made of aluminum, and provide the means of establishing electrical connection with the integrated circuits. Techniques such as wire bonding, tape automated bonding (TAB), and flip chip bonding, provide the link between the bond pad(s) 11 and other individual devices which together form a complete electronic system.

The surface of side 21 containing the integrated circuits is coated with a primary passivation layer 12. The primary passivation layer 12 is an insulating layer over surface 21 to protect it from contaminants, moisture, or particles. Devices usually employ a ceramic coating as layer 12 such as silicon oxides ($SiO_x$), silica ($SiO_2$), silicon carbide (SiC), silicon carbonitride ($SiC_xN_y$), silicon oxycarbide ($SiC_xO_y$), silicon oxycarbonitride ($SiC_xO_yN_z$), silicon nitride ($Si_xN_y$, i.e., $Si_3N_4$), silicon oxynitride ($Si_2N_2O$), phosphosilicate glass (PSG), boron phosphorous silicate glass (BPSG), an organic film, or a Group III oxide such as gallium oxide ($GaO_x$). Typically, these ceramic coatings are deposited by chemical vapor deposition (CVD), plasma enhanced chemical vapor deposition (PECVD), or physical vapor deposition (PVD) techniques. Most commonly, layer 12 is a PECVD film of silicon nitride or silicon oxynitride.

As depicted in FIG. 1, layer 12 extends up and over the outer edges of the bond pad 11. A window 13 with an edge 14 is opened in layer 12 to expose the bond pad 11 metal. While electrical connection can be made by welding leads directly to the exposed area of aluminum bond pad 11, most typically, an intermediate metal layer 15 of copper, tin, lead, titanium, or tungsten, is applied over the aluminum bond pad 11. Metal layer 15 provides chemical isolation for bond pad 11, and is used as a supporting surface for the gold or solder bumps 16 which function as a final electrical connection.

One of the problems encountered in these PRIOR ART devices, however, is that when the edge 14 of window 13 is too steep, difficulties arise when depositing metal layer 15, compromising the reliability of the IC device 30. However, we show in FIG. 2 an improved structure for a semiconductor chip 30A in an early stage of manufacture which will avoid such problems. This is accomplished by applying over primary passivation layer 12A, a flowable composition such as a solution containing a preceramic silicon-containing resin 17, followed by a silicon carbide ceramic layer 18.

The first step in providing this improved structure involves applying the flowable liquid resin composition as a coating to the surface of layer 12A, followed by heating the coating to a temperature sufficient to stabilize it, i.e., to convert the coating to silica-containing ceramic layer 17.

One type of flowable composition which can be used is a solution containing a hydridosiloxane resin which may contain units of the formula $HSi(OH)_x(OR)_yO_{z/2}$. R is independently an organic group or substituted organic group, which when bonded to silicon through the oxygen atom, forms a hydrolyzable substituent. Suitable R groups include alkyl groups such as methyl, ethyl, propyl, and butyl; aryl groups such as phenyl; and alkenyl groups such as allyl or vinyl. The value of x is 0–2; y is 0–2; z is 1–3; and the sum of x+y+z is 3.

These resins may be fully condensed hydrogen silsesquioxane resins $(HSiO_{3/2})_n$, resins which are only partially hydrolyzed (i.e., containing some $\equiv SiOR$), and/or resins which are partially condensed (i.e., containing some $\equiv SiOH$). In addition, the resin may contain less than about 10% of silicon atoms having either no hydrogen atoms, or two hydrogen atoms, which can occur during their formation or handling.

Hydrogen silsesquioxane resins are ladder or cage polymers which can be shown generally by the formula:

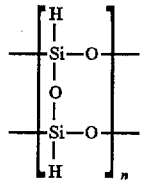

Typically, n has a value of four or more. By way of illustration, when n is four, a bond arrangement for a silsesquioxane cubical octamer is shown below:

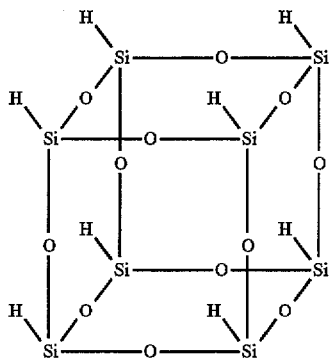

As this series is extended, i.e., n being ten or more, double-stranded polysiloxanes of indefinitely higher molecular weight are formed, containing regular and repeated cross-ties in their extended structure.

Hydrogen silsesquioxane resins and their method of preparation are described in U.S. Pat. No. 3,615,272 (Oct. 26, 1971), incorporated herein by reference. According to the method in the '272 patent, nearly fully condensed hydrogen silsesquioxane resin containing up to 100–300 parts per million silanol ($\equiv$SiOH), can be prepared by hydrolyzing trichlorosilane (HSiCl$_3$) in a benzenesulfonic acid hydrate hydrolysis medium, and washing the resulting resin with water or aqueous sulfuric acid. U.S. Pat. No. 5,010,159 (Apr. 23, 1991), also incorporated herein by reference, teaches another method of hydrolyzing hydridosilanes in an arylsulfonic acid hydrate hydrolysis medium to form the resin, which is then contacted with a neutralizing agent.

Other suitable resins are described in U.S. Pat. No. 4,999,397 (Mar. 12, 1991); including those resins produced by hydrolyzing an alkoxy or acyloxy silane in an acidic alcoholic hydrolysis medium, according to Japanese Kokai Patents J59-178749 (Jul. 6, 1990), J60-86017 (May 15, 1985), and J63-107122 (May 12, 1988); all incorporated by reference.

While hydridosiloxane resins are most preferred according to our invention, another type of silica precursor material which can be formed into the desired silica-containing ceramic layer 17, is a hydrolyzed or partially hydrolyzed compound of the formula R$_n$Si(OR)$_{4-n}$ in which R is the same as defined above and n is 0–3. Some of these types of materials are available commercially from Allied-Signal Inc., Morristown, N.J., under their tradename ACCU-GLASS. Compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of such compounds, the silicon atoms therein may be bonded to C, OH or OR groups, but a substantial portion of the material is believed to be condensed in the form of soluble Si—O—Si resins. Compounds in which n is 2 or 3 are generally not used alone, as volatile cyclic structures are generated during pyrolysis, but small amounts of such compounds may be cohydrolyzed with other silanes in which n is zero or one, to prepare useful preceramic materials. In some instances, it may be desirable to form layer 17 from organic materials such as a benzocyclobutene (BCB) or a polyimide resin.

The flowable composition can be stabilized, i.e., formed into silica-containing ceramic layer 17, by any known technique. In a preferred method, a solution of a solvent and the preceramic resin is applied to layer 12A, and the solvent is evaporated. The solution can be formed by simply dissolving or dispersing the preceramic resin in the solvent or in a mixture of solvents. Some suitable solvents are aromatic hydrocarbons such as benzene or toluene; alkanes such as n-heptane or dodecane; ketones; cyclic polydimethylsiloxanes such as octamethylcyclotetrasiloxane and decamethylcyclopentasiloxane; esters; or ethers. Generally, enough solvent is used to form a 0.1–85 weight percent solution of the resin, preferably 5–30 weight percent.

Additional materials may be added to the flowable composition such as other preceramic materials or preceramic polymer precursors; oxides such as aluminum, titanium, zirconium, tantalum, niobium, vanadium, boron, or phosphorous, at 0.1–50 weight percent; catalysts such as platinum, rhodium, or copper, at 5–500 parts per million based on the weight of the resin or a filler.

The preceramic resin solution can be coated on the surface of layer 12A by spin coating, dip coating, spray coating, or flow coating. This is followed by evaporation of the solvent to form preceramic layer 17. Although a solution approach is most desirable, melt coating can also be employed. The preceramic resin is then stabilized, i.e., converted into silica-containing ceramic layer 17, by heating it to a temperature sufficient for ceramification. Generally, this temperature is in the range of 50°–800° C., preferably 50°–600° C., more preferably 100°–400° C. The time of heating should be sufficient to form a silica-containing ceramic layer 17, and is generally up to about 6 hours, with a range of 5 minutes to about 3 hours being most preferred.

Heating may be conducted at any effective atmospheric pressure from vacuum to superatmospheric, and under any effective oxidizing or non-oxidizing gaseous environment. Suitable gases include air, O$_2$, inert gases such as N$_2$, ammonia, amines, moisture, N$_2$O, and hydrogen. Any heating means can be used such as a convection oven, rapid thermal processor, hot plate, radiant or microwave energy. The rate of heating is not critical but it is most practical to heat as rapidly as possible.

Silica-containing ceramic layer 17 may contain amorphous silica (SiO$_2$), and amorphous silica-like materials that are not fully free of residual carbon, silanol ($\equiv$SiOH), and/or hydrogen. The resulting amorphous silicon oxide layer 17 can be porous or condensed, depending upon the temperature used for its ceramification. The stabilized layer 17 provides a more planar surface above the bond pad 11A than the sharp edge 14 of window 13 employed in the PRIOR ART integrated circuit device 30 shown in FIG. 1.

With reference to FIG. 2, a silicon carbide ceramic layer 18 is shown applied to the surface of amorphous silicon oxide layer 17. The layer 18 can be applied by chemical vapor deposition techniques such as thermal chemical vapor deposition (CVD), photochemical vapor deposition, plasma enhanced chemical vapor deposition (PECVD), electron cyclotron resonance (ECR), or jet vapor deposition. In addition, it can be applied by physical vapor deposition (PVD) techniques such as sputtering, or electron beam evaporation. These processes involve the addition of energy in the form of heat or plasma to a vaporized species to cause the desired reaction, or the focusing of energy on a solid sample of the material to cause its deposition.

In PECVD techniques, a precursor gas is reacted by passing it through a plasma field. Reactive species form and are focused at the substrate where they readily adhere. The advantage of a PECVD process over a thermal CVD process is that in PECVD, lower substrate temperatures, i.e., 50°–400° C., can be employed.

Plasma used in PECVD processes can be energy derived from electric discharges, electromagnetic fields in the radio-frequency or microwave range, lasers, or particle beams. Preferred, however, is the use of radio frequency (i.e., 10 kHz to $10^2$ MHz), or microwave energy (i.e., 0.1–10 GHz), at moderate power densities (i.e., 0.1–5 watts/cm$^2$). Frequency, power, and pressure, can be tailored to a particular precursor gas and equipment being employed.

Suitable precursor gases include (1) mixtures of silanes or halosilanes such as trichlorosilane (HSiCl$_3$), with an alkane having 1–6 carbon atoms such as methane, ethane, or propane; (2) an alkylsilane such as methylsilane (CH$_3$SiH$_3$), dimethylsilane (CH$_3$)$_2$SiH$_2$, trimethylsilane (CH$_3$)$_3$SiH, or hexamethyldisilane (CH$_3$)$_3$Si—Si(CH$_3$)$_3$; or (3) silacyclobutanes or disilacyclobutanes of the type described in U.S. Pat. No. 5,011,706 (Apr. 30, 1991), incorporated herein by reference.

Examples of such silacyclobutanes (1) and disilacyclobutanes (2) are shown below, wherein R1 is hydrogen, fluorine, or a hydrocarbon radical having 1–4 carbon atoms; and R2 is hydrogen or hydrocarbon radical having 1–4 carbon atoms. One suitable disilacyclobutane is 1,3-dimethyl-1,3-disilacyclobutane shown in formula (3).

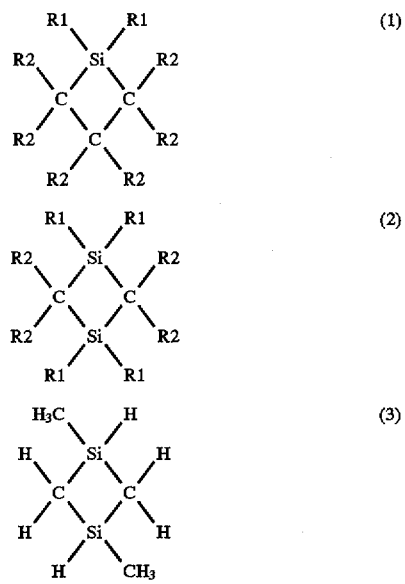

The preferred technique of our invention for forming silicon carbide ceramic layer 18 is the plasma enhanced chemical vapor deposition of trimethylsilane. The resulting amorphous silicon carbide ceramic layer 18 is mechanically and chemically robust, and it protects semiconductor die 30A during KGD testing and handling. In addition, layer 18 forms a hermetic and electrical barrier over the surface of amorphous silicon oxide layer 17 and over surface 12A of semiconductor chip 30A.

After ceramic layers 17 and 18 are applied, portions of the layers covering bond pad 11A can be removed by etching or partial etching, to allow for attachment of leads to the bond pad, or for application of additional conductive metal layers to the top of the bond pad. This result of this procedure is depicted generally in FIG. 3. Etching can be accomplished by dry etching using plasma, combined with wet etching with hydrofluoric acid, and/or laser ablation. As an alternative, ceramic layers 17 and 18 may be applied in a manner so as not to coat bond pad 11A in its entirety, in which case etching or partial etching is not required.

The resulting tapered opening 13A in FIG. 3 allows for a more uniform deposition of the diffusion barrier metal layer 15A seen in FIG. 4, increasing its stability, and its ability to prevent interaction with the underlaying aluminum of bond pad 11A. Thus, as shown in FIG. 4, bond pad 11A can be sealed by covering it with a non-corroding conductive metal layer 16A, although in some cases, a corrodible material can be employed. Layer 16A is most preferably a gold or solder (95Pb-5Sn) bump, although it can be any metal which is stable in the environment, electrically conductive, and useful for interconnecting circuits of semiconductor die 30A. Some suitable materials include copper, silver, silver filled epoxy, silver-filled polyimide, silver-filled polysiloxanes, silver-filled silicone elastomers, or silver-filled silicone resins. Methods for applying conductive metal layer 16A are sputtering and electron beam evaporation. It can also be applied by merely dispensing the metallic material directly onto the top of metal layer 15A, or directly onto the top of bond pad 11A where a metal layer 15A is not present.

According to sputtering techniques, the part to be coated, i.e., the semiconductor die 30A, is placed in an evacuated chamber in close proximity to a flat plate of the coating material, i.e., the metal. The flat plate is the target and is bombarded by a beam of electrons. The electrons knock atoms off the target onto the surface of the part facing it. Only portions of the part directly exposed to the target are coated. The advantages of sputtering are that purity of a coating can be controlled, and parts are not required to be heated during the process. Techniques involving heat such as electron beam heating can also be employed.

The aluminum metal of bond pad 11A is often incompatible with metallic material used to form conductive layer 16A. When the two metals are contacted, often a non-conducting alloy can form (for example, gold and aluminum alloys form "purple plague"), which can damage the circuit. To prevent damage, diffusion barrier metal layer 15A is applied between bond pad 11A and layer 16A. Metals for forming layer 15A include nickel, copper, titanium, tungsten, vanadium, chromium, platinum, and palladium; and metal alloys such as titanium-tungsten (TiW) or titanium nitride (TiN). Metal layer 15A can be applied by sputtering the metal or metal alloy onto the exposed surface of bond pad 11A, or by dispensing metallic material directly onto the top of bond pad 11A.

The quality and reliability of integrated circuit devices 30A according to our invention is therefore achieved by using metal layers 15A and 16A having tapering edges as shown in FIG. 4. This is in contrast to PRIOR ART devices 30 in FIG. 1, having a straight or steep edge 14, which causes difficulties when depositing metal layers, thus compromising reliability of such IC devices.

Following certification of the semiconductor chip 30A as reliable KNOWN GOOD DIE according to the test protocols, chips 30A can be interconnected with one another, or connected with a lead frame, circuit board, or other external component. The interconnections can be made using conventional leads, TAB, or "flip chip" processing techniques. After interconnection, chip 30A can be packaged by embedding it within an organic encapsulant such as a polyimide; an epoxy; or a polyxylylene sold under the trademark PARYLENE® by Union Carbide, Danbury, Conn. Chip 30A can also be embedded within a silicone encapsulant, or included in a plastic package for additional protection, if desired.

Other variations may be made in compounds, compositions, or methods described herein without departing from the essential features of our invention. The forms of our invention are exemplary only and not limitations on its scope defined in the claims.

We claim:

1. A method of making a semiconductor device having enhanced performance in KNOWN GOOD DIE test protocols comprising providing a semiconductor chip or die comprising a substrate with a surface containing integrated circuits interconnected with at least one bond pad, the die having a primary passivation layer that overlays the circuits and overlaps edges of the bond pad terminating in a tapered window forming an opening over the bond pad, A. applying a resin-containing flowable liquid composition as part of the primary passivation layer, or on top of the primary passivation layer to planarize the surface;

B. heating the composition to a temperature sufficient to stabilize it;

C. applying an amorphous silicon carbide coating to the layer formed in step A to provide chemical and mechanical protection to the die;

D. exposing a portion of the bond pad by fabricating an opening through the layers applied in steps A—C;

E. optionally depositing and patterning a first diffusion barrier metal layer on the exposed portion of the bond pad, the first metal layer overlapping the opening in the primary passivation layer; and F. depositing a second conductive metal layer on the first metal layer above the bond pad, or if no first metal layer is deposited, then depositing the second metal layer on the exposed portion of the bond pad.

2. A method according to claim 1 wherein the flowable composition in step A is hydrogen silsesquioxane resin in a solvent, and the resin is diluted to 5–30 weight percent solids.

3. A method according to claim 1 wherein the silicon carbide in step C is applied by introducing a source gas into a process selected from the group consisting of thermal chemical vapor deposition, photochemical vapor deposition, plasma enhanced chemical vapor deposition, electron cyclotron resonance, and jet vapor deposition.

4. A method according to claim 3 wherein the source gas is a mixture of a silane and an alkane of 1–6 carbon atoms, an alkylsilane, a silacyclobutane, or a disilacyclobutane.

5. A method according to claim 4 wherein silicon carbide is applied by chemical vapor deposition of trimethylsilane.

6. A method according to claim 1 wherein the first metal layer is selected from the group consisting of nickel, copper, titanium, tungsten, vanadium, chromium, platinum, palladium, titanium-tungsten, and titanium nitride.

7. A method according to claim 1 wherein the second metal layer is selected from the group consisting of gold, solder, copper, silver, silver-filled epoxy, silver-filled polyimide, silver-filled polysiloxane, silver-filled silicone elastomer, and silver-filled silicone resin.

8. A method according to claim 1 wherein the primary passivation layer is silicon oxide, silicon nitride, silicon carbide, or a Group III oxide.

9. A method according to claim 1 including the additional step of providing a temporary connection between the second metal layer and external test circuitry of KNOWN GOOD DIE test apparatus.

10. A method according to claim 9 including the further step of testing the chip by electrically stressing the chip at an elevated temperature and voltage for time sufficient to cause failure of marginal chips.

11. Semiconductor chips according to the method in claim 1.

* * * * *